(12) United States Patent
Shimizu et al.

(10) Patent No.: US 8,638,832 B2
(45) Date of Patent: Jan. 28, 2014

(54) ELECTRONIC DEVICE, SURFACE EMITTING LASER, SURFACE EMITTING LASER ARRAY, LIGHT SOURCE, OPTICAL MODULE

(71) Applicant: Furukawa Electric Co., Ltd., Tokyo (JP)

(72) Inventors: Hitoshi Shimizu, Tokyo (JP); Yasumasa Kawakita, Tokyo (JP)

(73) Assignee: Furakawa Electric Co., Ltd., Tokyo (JP)

(*) Notice: Subject to any disclaimer, the term of this patent is extended or adjusted under 35 U.S.C. 154(b) by 0 days.

(21) Appl. No.: 13/855,353

(22) Filed: Apr. 2, 2013

(65) Prior Publication Data

US 2013/0215922 A1    Aug. 22, 2013

Related U.S. Application Data

(63) Continuation of application No. PCT/JP2011/005506, filed on Sep. 29, 2011.

(30) Foreign Application Priority Data

Oct. 4, 2010 (JP) ................................. 2010-225075

(51) Int. Cl.
*H01S 5/00* (2006.01)
(52) U.S. Cl.
USPC .................. 372/50.124; 372/50.11; 372/50.1; 372/45.01; 372/46.01
(58) Field of Classification Search
USPC ........... 372/50.124, 50.11, 50.1, 45.01, 46.01
See application file for complete search history.

(56) References Cited

U.S. PATENT DOCUMENTS

| 5,245,622 A * | 9/1993 | Jewell et al. ............... 372/45.01 |
| 6,148,016 A | 11/2000 | Hegblom et al. |
| 6,750,071 B2 | 6/2004 | Chirovsky et al. |
| 2004/0184498 A1* | 9/2004 | Ueki ............................. 372/45 |
| 2005/0249254 A1 | 11/2005 | Deppe |
| 2006/0171437 A1* | 8/2006 | Takahashi ............... 372/50.124 |
| 2007/0053399 A1 | 3/2007 | Johnson et al. |

FOREIGN PATENT DOCUMENTS

| DE | 69323433 T2 | 9/1999 |
| JP | 3-265124 A | 11/1991 |
| JP | 2003-179308 A | 6/2003 |
| JP | 2004-103754 A | 4/2004 |
| JP | 2006-245473 A | 9/2006 |
| JP | 2009-246035 A | 10/2009 |
| JP | 2009-283722 A | 12/2009 |

OTHER PUBLICATIONS

International preliminary report on patentability issued Apr. 18, 2013 corresponds to PCT/JP2011/005506.

(Continued)

*Primary Examiner* — Kinam Park
(74) *Attorney, Agent, or Firm* — Lowe Hauptman & Ham, LLP

(57) ABSTRACT

An electronic device comprising a multilayer semiconductor structure formed by a periodic structure having a first semiconductor layer and a second semiconductor layer, wherein in at least a portion of the multilayer semiconductor structure, the first semiconductor layer and the second semiconductor layer have different conduction types. The first semiconductor layer and the second semiconductor layer have different refractive indexes, and the multilayer semiconductor structure functions as a multilayer reflective mirror. As a result, an electronic device, a surface emitting laser, a surface emitting laser array, a light source, and an optical module with decreased parasitic capacitance can be realized.

18 Claims, 14 Drawing Sheets

(56) References Cited

OTHER PUBLICATIONS

Office Action mailed Jun. 17, 2013 corresponds to German patent application No. 112011102431.2.
International Search Report corresponding to PCT/JP2011/005506, dated Nov. 29, 2011.
Shigeaki Sekiguchi et al., "Auto-doping of Carbon to AlAs Grown by Metalorganic Chemical Vapor Deposition using Trimethylaluminum and Tertiarybutylarsine", Jpn. J. Appl. Phys. vol. 36 (1997) pp. 2638-2639, Part 1, No. 5A, (May 1997).

* cited by examiner

ELECTRONIC DEVICE, SURFACE EMITTING LASER, SURFACE EMITTING LASER ARRAY, LIGHT SOURCE, OPTICAL MODULE

The contents of the following Japanese patent application and PCT application are incorporated herein by reference:
NO.JP2010-225075 filed on Oct. 4, 2010, and
NO.PCT/JP2011/005506 filed on Sep. 29, 2011.

BACKGROUND

1. Technical Field

The present invention relates to an electronic device, a surface emitting laser (i.e. a vertical cavity surface emitting laser (VCSEL)), a surface emitting laser array, a light source, and an optical module.

2. Related Art

A surface emitting laser having an intra-cavity structure is known as a light source for optical interconnection, as shown in Patent Documents 1 and 2, for example. The intra-cavity structure is a structure in which current is injected into the active layer from inside two reflective mirrors, e.g. DBR (Distributed Bragg Reflector) minors, forming an optical cavity, without passing through the reflective minors in one or both directions.

In the surface emitting laser described in Patent Document 1, a lower DBR minor is formed on a substrate. An n-type contact layer and an active layer are sequentially formed on the lower DBR minor, and an n-side electrode is formed on the n-type contact layer. Furthermore, a p-side electrode is formed on the active layer and an upper DBR mirror is formed above the p-side electrode. The surface emitting laser described in Patent Document 1 has a double intra-cavity structure in which current can be injected into the active layer without passing through either the upper or lower DBR minors. With this intra-cavity structure, the surface emitting laser described in Patent Document 1 can realize a low threshold current and high power efficiency.

In the case of an intra-cavity structure in which the current is injected to the active layer without passing through the lower DBR mirror, the lower DBR minor is usually made of an undoped semiconductor, in order to decrease the parasitic capacitance, for example.

Patent Document 1: U.S. Pat. No. 6,750,071
Patent Document 2: Japanese Patent Application Publication No. 2004-103754
Non-Patent Document 1: S. Sekiguchi, et al., Jpn. J. Appl. Phys., Vol. 36, pp. 2638-2639 (1997)

However, beyond the case of a surface emitting laser, in a case of an electronic device that operates by application of a modulated electrical signal, problems may occur such as a decrease in the cutoff frequency of the electronic device due to the parasitic capacitance and an increase in crosstalk between components which occurs when the electronic device is configured in an array. In particular, cutoff frequencies with high frequency characteristics of 20 GHz or more are desired, and there is a great demand for electronic devices that have decreased parasitic capacitance.

SUMMARY

Therefore, it is an object of an aspect of the innovations herein to provide an electronic device, a surface emitting laser, a surface emitting laser array, a light source, and an optical module having decreased parasitic capacitance, which are capable of overcoming the above drawbacks accompanying the related art. The above and other objects can be achieved by combinations described in the claims.

To solve the above problems, according to a first aspect of the present invention, provided is an electronic device comprising a multilayer semiconductor structure formed by a periodic structure having a first semiconductor layer and a second semiconductor layer. In at least a portion of the multilayer semiconductor structure, the first semiconductor layer and the second semiconductor layer have different conduction types.

According to another aspect of the present invention, in the electronic device described above, the first semiconductor layer and the second semiconductor layer have different refractive indexes, and the multilayer semiconductor structure functions as a multilayer reflective mirror.

According to a second aspect of the present invention, provided is A surface emitting laser comprising a lower multilayer reflective semiconductor minor formed by a periodic structure having a first low refractive index layer and first high refractive index layer, which has a higher refractive index than the first low refractive index layer; an upper multilayer reflective mirror formed by a periodic structure having a second low refractive index layer and second high refractive index layer, which has a higher refractive index than the second low refractive index layer; an active layer provided between the lower multilayer reflective semiconductor mirror and the upper multilayer reflective mirror; and a lower contact layer that is provided between the active layer and the lower multilayer reflective semiconductor minor, and on which is formed a lower electrode for supplying current to the active layer. In at least a portion of the lower multilayer reflective semiconductor minor, the first low refractive index layer and the first high refractive index layer have different conduction types.

According to another aspect of the present invention, in the surface emitting laser described above, p-type and n-type carrier concentrations in the first low refractive index layer and the first high refractive index layer having different conduction types are both lower than $1 \times 10^{17}$ cm$^{-3}$.

According to another aspect of the present invention, in the surface emitting laser described above, the lower multilayer reflective semiconductor mirror includes an element that has a property of capturing carbon.

According to another aspect of the present invention, in the surface emitting laser described above, the element having the property of capturing carbon is aluminum (Al).

According to another aspect of the present invention, in the surface emitting laser described above, in the lower multilayer reflective semiconductor mirror, the first low refractive index layer is made of AlGaAs and the first high refractive index layer is made of (Al)GaAs.

According to another aspect of the present invention, in the surface emitting laser described above, in the lower multilayer reflective semiconductor mirror, the first low refractive index layer is made of AlGaInP and the first high refractive index layer is made of (Al)GaInP.

According to another aspect of the present invention, in the surface emitting laser described above, in the lower multilayer reflective semiconductor mirror, the first low refractive index layer is made of InP and the first high refractive index layer is made of AlGaInAs.

According to another aspect of the present invention, the surface emitting laser described above comprises a current confinement layer that is provided between the upper multilayer reflective mirror and the active layer, and that includes a current injecting section made of $Al_{1-x}Ga_xAs$ ($0 \leq x < 0.2$) and a current confining section made of $(Al_{1-x}Ga_x)_2O_3$ and formed by selective oxidation; an upper contact layer that is provided between the upper multilayer reflective mirror and the current confinement layer and that has an upper electrode formed thereon to supply current to the active layer; and a high conductivity layer that is provided between the upper contact layer and the current confinement layer and has higher conductivity than the upper contact layer.

According to another aspect of the present invention, in the surface emitting laser described above, the cutoff frequency is greater than or equal to 20 GHz.

According to another aspect of the present invention, provided is a surface emitting laser array comprising a plurality of any one of the surface emitting lasers described above arranged in a one-dimensional or two-dimensional array.

According to another aspect of the present invention, provided is a light source comprising any one of the surface emitting lasers or the surface emitting laser array described above; and a controller that applies a modulated signal to the surface emitting laser or the surface emitting laser array.

According to another aspect of the present invention, provided is an optical module comprising any one of the surface emitting lasers, the surface emitting laser array, or the light source described above.

With the present invention, an electronic device, a surface emitting laser, a surface emitting laser array, a light source, and an optical module with decreased parasitic capacitance can be realized.

The summary clause does not necessarily describe all necessary features of the embodiments of the present invention. The present invention may also be a sub-combination of the features described above.

DESCRIPTION OF EXEMPLARY EMBODIMENTS

Figure 1:
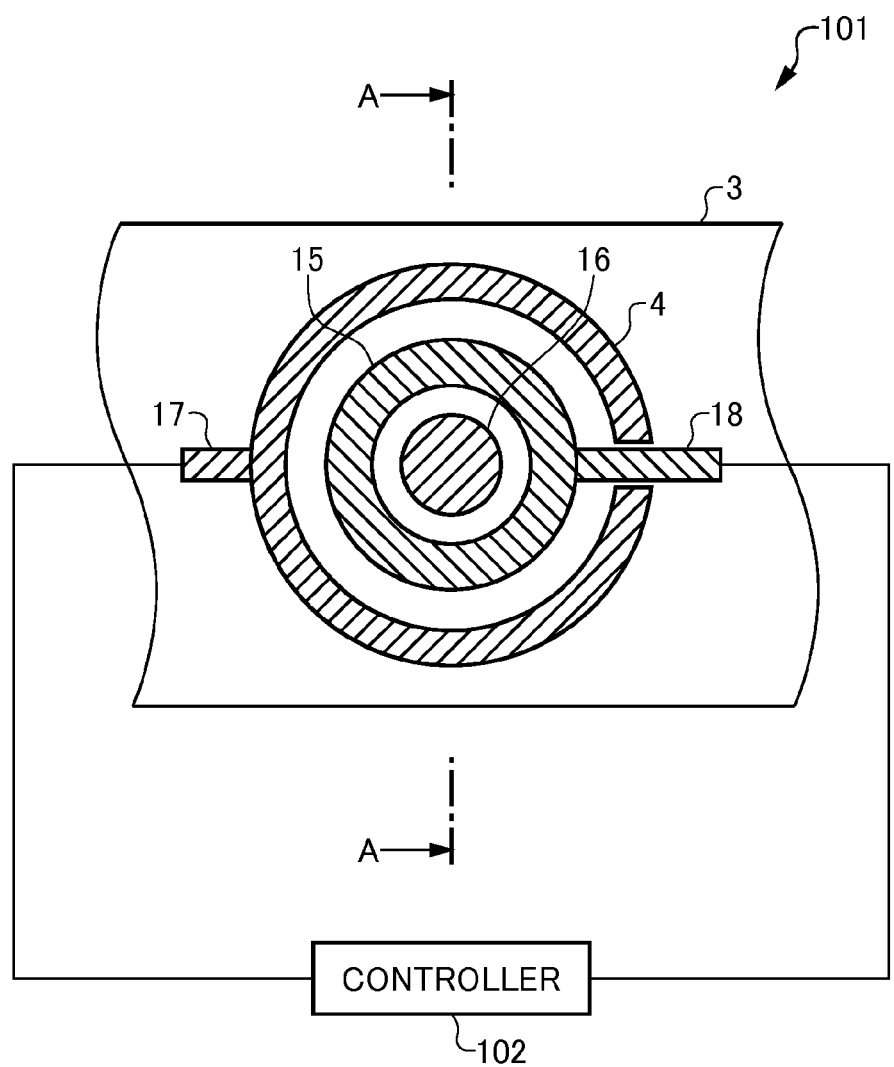
FIG. 1 is a schematic view of a configuration of a light source according to a first embodiment of the present invention.

The following describes embodiments of an electronic device, a surface emitting laser, a surface emitting laser array, a light source, and an optical module according to the present invention, with reference to the drawings. The present invention is not limited by these embodiments, and all the combinations of the features described in the embodiments are not necessarily essential to means provided by aspects of the invention. In the drawings, identical or corresponding components are given the same reference numerals. Furthermore, the drawings are schematic representations and do not necessarily represent the thickness and width relationships of each layer or the ratios therebetween. Different drawings may display different portions using different dimensional ratios.

(First Embodiment)

Figure 2:
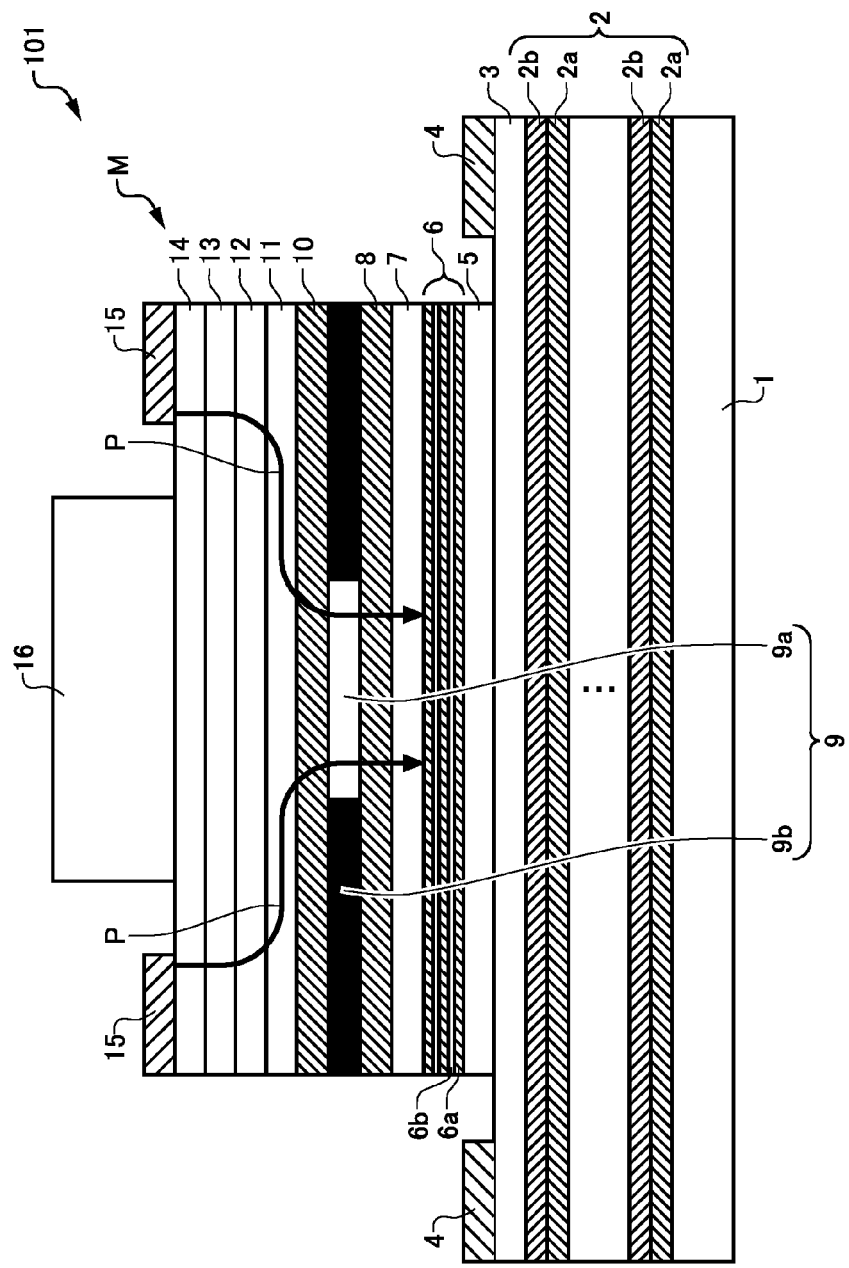
FIG. 2 is a cross-sectional view of the surface emitting laser shown in FIG. 1 over the line A-A.

FIG. 1 is a schematic view of a configuration of a light source 100 according to a first embodiment of the present invention. As shown in FIG. 1, the light source 100 includes a surface emitting laser 101, which is an example of an electronic device, and a controller 102 that controls the surface emitting laser 101. FIG. 2 is a cross-sectional view of the surface emitting laser 101 shown in FIG. 1 over the line A-A.

As shown in FIGS. 1 and 2, the surface emitting laser 101 includes a lower DBR mirror 2 that functions as a lower multilayer reflective semiconductor mirror, an n-type contact layer 3 that is a lower contact layer, an n-side electrode 4 that is a lower electrode, an n-type cladding layer 5, an active layer 6, a p-type cladding layer 7, a lower graded-composition layer 8, a current confinement layer 9, an upper graded-composition layer 10, a p-type spacer layer 11, a p-type high conductivity layer 12, a p-type spacer layer 13, a p-type contact layer 14 that is an upper contact layer, a p-side electrode 15 that is an upper electrode, an upper DBR minor 16 that functions as an upper multilayer reflective mirror, an n-side lead electrode 17, and a p-side lead electrode 18, all of which are layered on an n-type GaAs substrate with a surface orientation of (001).

The lower DBR mirror 2 and the upper DBR minor 16 form an optical cavity. The active layer 6 is provided between the lower DBR mirror 2 and the upper DBR minor 16. The current confinement layer 9 is provided between the upper DBR mirror 16 and the active layer 6. The p-type contact layer 14 is provided between the upper DBR mirror 16 and the current confinement layer 9. The n-type contact layer 3 is provided between the lower DBR mirror 2 and the active layer 6. The upper graded-composition layer 10 and the lower graded-composition layer 8 are formed to sandwich the current confinement layer 9, with the upper graded-composition layer 10 being arranged on the p-type contact layer 14 side and the lower graded-composition layer 8 being arranged on the active layer 6 side. The p-type high conductivity layer 12 is provided between the p-type contact layer 14 and the current confinement layer 9.

The layered structure from the n-type cladding layer 5 to the p-type contact layer 14 is formed as a cylindrical mesa post M, using an etching process, for example. The mesa post diameter is 30 µm, for example. The n-type contact layer 3 extends beyond the perimeter of the mesa post M. The p-side electrode 15 is formed on the p-type contact layer 14, and the n-side electrode 4 is formed on the n-type contact layer 3.

The following describes each component in detail. The lower DBR mirror 2 is formed above the n-type GaAs substrate, with an undoped GaAs buffer layer formed therebetween. The lower DBR mirror 2 is formed as a multilayer semiconductor minor that includes a periodic structure of a low refractive index layer 2a, which is a first low refractive index layer made of p-type $Al_{0.9}Ga_{0.1}As$, and a high refractive index layer 2b, which is a first high refractive index layer made of n-type GaAs. With one low refractive index layer 2a and one high refractive index layer 2b forming one pair, the lower DBR mirror 2 may include 40.5 pairs, for example. The thickness of each low refractive index layer 2a and high refractive index layer 2b is $\lambda/4n$, where $\lambda$ is the oscillation wavelength and n is the refractive index. The p-type carrier concentration of the low refractive index layers 2a and the n-type carrier concentration of the high refractive index layers 2b are each $5\times10^{16}$ cm$^{-3}$.

The n-type contact layer 3 and the n-type cladding layer 5 are formed using n-type GaAs as the material. The p-type cladding layer 7 is formed using p-type AlGaAs, preferably $Al_{0.3}Ga_{0.7}As$, for example, as the material. The n-type cladding layer 5 and the p-type cladding layer 7 are formed to sandwich the active layer 6, thereby forming a separate confinement heterostructure (SCH).

The p-type spacer layer 11 is formed using p-type AlGaAs as the material. The p-type high conductivity layer 12 is formed using p-type AlGaAs as the material. The p-type spacer layer 13 is formed using p-type AlGaAs as the material. The p-type contact layer 14 is formed using p-type GaAs as the material.

The n-type cladding layer 5, the p-type cladding layer 7, and the p-type spacer layers 11 and 13 are doped with a p-type or n-type dopant to have a carrier concentration of approximately $1\times10^{18}$ cm$^{-3}$, for example, thereby ensuring p-type or n-type conduction. The n-type contact layer 3 and the p-type contact layer 14 may have respective carrier concentrations of approximately $2\times10^{18}$ cm$^{-3}$ and $3\times10^{19}$ cm$^{-3}$. The p-type high conductivity layer 12 has a carrier concentration of no less than $3\times10^{19}$ cm$^{-3}$, and greater electrical conductivity than the p-type contact layer 14 and the p-type spacer layers 11 and 13. The p-type high conductivity layer 12 is a path in the lateral direction of the drawing for current injected from the p-side electrode 15, and functions to more efficiently inject current into the active layer 6.

To achieve high electrical conductivity and low resistance, the carrier concentration of the p-type high conductivity layer 12 is preferably no less than $3\times10^{19}$ cm$^{-3}$, and when considering ease of manufacturing, no greater than $1\times10^{21}$ cm$^{-3}$. More than one layers of the p-type high conductivity layer may be provided.

The current confinement layer 9 is formed by an aperture 9a functioning as a current injection section and a selective oxidation layer 9b functioning as a current confinement section. The aperture 9a is made from $Al_{1-x}Ga_xAs$ ($0 \leq x \leq 0.2$) and the selective oxidation layer 9b is made of $(Al_{1-x}Ga_x)_2O_3$. Here, x may be 0.02, for example. The current confinement layer 9 has a thickness of 30 nm, for example, and is formed by selectively oxidizing an Al-containing layer made of $Al_{1-x}Ga_xAs$. Specifically, the selective oxidation layer 9b is formed as a ring around the periphery of the aperture 9a, by oxidizing only a prescribed range along the layered surface from the periphery of the Al-containing layer. The selective oxidation layer 9b has insulating properties and confines the current injected from the p-side electrode 15 to focus this current in the aperture 9a, thereby increasing the current density within the active layer 6 directly below the aperture 9a. The aperture diameter of the aperture 9a may be 6 µm, for example, is preferably from 4 µm to 15 µm, and is more preferably from 5 µm to 10 µm.

The active layer 6 has a multiple quantum well (MQW) structure obtained by layering three quantum well layers 6a and two barrier layers 6b in an alternating manner. Each quantum well layer 6a is formed of a GaInAs-type semiconductor material, such as $Ga_{0.75}In_{0.25}As$, for example. Each barrier layer 6b is formed of GaAs, for example. The thickness and composition of the semiconductor material of the active layer 6 is set such that the current injected from the p-side electrode 15 and confined by the current confinement layer 9 causes the active layer 6 to perform spontaneous emission of light that includes light with a wavelength of 850 nm or more.

The upper DBR mirror 16 is formed as a multilayer dielectric mirror that includes a periodic structure of an $SiO_2$ layer, which functions as a second low refractive index layer, and a SiN layer, which functions as a second high refractive index layer. With one $SiO_2$ layer and one SiN layer forming one pair, the upper DBR minor 16 may include 9 pairs, for example. The thickness of the $SiO_2$ layer and SiN layer is $\lambda/4n$, in the same manner as in the lower DBR mirror 2. The diameter of the upper DBR mirror 16 is less than the diameter of the p-type contact layer 14, and therefore the p-type contact layer 14 extends beyond the periphery of the upper DBR mirror 16.

The p-side electrode 15 is used to inject current into the active layer 6, and is formed as a ring surrounding the upper DBR mirror 16 on the extending portion of the surface of the p-type contact layer 14 described above. In other words, the p-side electrode 15 is formed on the p-type contact layer 14 without the upper DBR mirror 16 being interposed therebetween. On the other hand, the n-side electrode 4 is formed on the extending portion of the surface of the n-type contact layer 3 that extends beyond the periphery of the mesa post M. The n-side electrode 4 is used to inject current to the active layer 6, and is formed in a C-shape to surround the mesa post M. In other words, the n-side electrode 4 is formed on the n-type contact layer 3 without the lower DBR mirror 2 interposed therebetween. The n-side lead electrode 17 and the p-side lead electrode 18 are respectively connected to the n-side electrode 4 and the p-side electrode 15. In this way, the surface emitting laser 101 has a double intra-cavity structure in which current can be injected directly to the active layer 6 without passing through the lower DBR mirror 2 or the upper DBR minor 16.

The controller 102 is electrically connected to the n-side electrode 4 and the p-side electrode 15, via the n-side lead electrode 17 and the p-side lead electrode 18. The controller 102 is configured to apply, between the p-side electrode 15 and the n-side electrode 4, a prescribed bias voltage and a modulated voltage as a modulated signal having an amplitude centered on the bias voltage and substantially the same in the positive and negative directions. The controller 102 may be realized by an IC driver, which is widely known for laser driving, for example. The modulation frequency of the modulated voltage may be greater than or equal to 10 GHz, for example.

The following describes the operation of the light source 100. First, the controller 102 injects current by applying the bias voltage and the modulated voltage between the p-side electrode 15 and the n-side electrode 4. As shown by the path P in FIG. 2, the p-side carriers (holes) flow from the p-side electrode 15 through the p-type contact layer 14 and the p-type spacer layer 13, flow in a lateral direction in the drawing within the p-type high conductivity layer 12 having high electrical conductivity, flow through the p-type spacer layer 11 and the upper graded-composition layer 10, are focused by the aperture 9a of the current confinement layer 9 to have increased density, and in this state are injected to the active layer 6 through the lower graded-composition layer 8. On the other hand, the n-side carriers (electrons) flow from the n-side electrode 4 through the n-type contact layer 3 and the n-type cladding layer 5, to be injected to the active layer 6.

The active layer 6 into which the current is injected performs spontaneous emission of light. The light from the spontaneous emission is laser-oscillated by a wavelength of 850 nm or more, e.g. a wavelength in the 1000 nm band, due to the effect of the optical cavity and the optical amplification effect of the active layer 6. As a result, the surface emitting laser 101 outputs laser light corresponding to the modulated signal from the upper DBR minor 16 side.

The surface emitting laser 101 has a double intra-cavity structure. As a result, there are few hetero-interfaces between the active layer 6 and the p-side electrode 15 and n-side electrode 4, and therefore the surface emitting laser 101 has a low threshold current characteristic and high current efficiency characteristic.

Furthermore, in the surface emitting laser 101, the lower DBR minor 2 has a periodic structure including the p-type low refractive index layers 2a and the n-type high refractive index layers 2b. As a result, the depletion layer expands at the interface of the pn junctions between the low refractive index layers 2a and the high refractive index layers 2b, and therefore the capacity of the lower DBR mirror 2 decreases. Accordingly, the parasitic capacitance of the surface emitting laser 101 decreases, thereby preventing a decrease in the cutoff frequency and realizing operation at a higher speed.

(Manufacturing Method)

The following describes an exemplary method for manufacturing the light source 100 according to the first embodiment. First, a widely known growth method such as MBE, gas-source MBE, or MOCVD is used to sequentially form the lower DBR minor 2, the n-type contact layer 3, the n-type cladding layer 5, the active layer 6, the p-type cladding layer 7, the lower graded-composition layer 8, an Al-containing layer made from $Al_{1-x}Ga_xAs$ to serve as the current confinement layer 9, the upper graded-composition layer 10, the p-type spacer layer 11, the p-type high conductivity layer 12, the p-type spacer layer 13, and the p-type contact layer 14 on the n-type GaAs substrate having an undoped GaAs buffer layer formed on the surface thereof.

If MOCVD is used, the raw material gas may include trimethylgallium (TMGa) or trimethylaluminum (TMAl) as the organic metal material and arsine ($AsH_3$) as the As material, for example. When forming the n-type semiconductor layer, an n-type dopant such as silicon (Si) may be used for the doping. When forming the p-type semiconductor layer, a p-type dopant such as zinc (Zn) may be used for the doping. The high refractive index layers 2b of the lower DBR minor 2 are formed as a result of intentional doping with the n-type dopant. The low refractive index layers 2a are formed as a result of intentional doping with the p-type dopant.

When growing an undoped lower DBR mirror using MOCVD or the like as in a conventional surface emitting laser, the carbon (C) in the organic metal material is unintentionally auto-doped in the semiconductor layer and the lower DBR minor is likely to have p-type conductivity with a carrier concentration of $1 \times 10^{17}$ $cm^{-3}$, as described in Non-Patent Document 1. In particular, when aluminum (Al) is included as a structural element, as in the low refractive index layer, the Al has a quality of being absorbed together with the C in the semiconductor layer, and this makes it likely that the p-type carrier concentration will be increased. The phenomenon of the lower DBR minor being likely to have p-type conductivity also occurs when MBE using an organic metal material is used. When the lower DBR minor has p-type conductivity in this way, the capacity of the lower DBR minor increases.

In contrast to this, in the lower DBR mirror 2 of the first embodiment, even if the C is auto-doped when growing the high refractive index layer 2b, the n-type dopant is also doped to realize n-type conductivity. By using the periodic structure including the n-type high refractive index layers 2b and the p-type low refractive index layers 2a, the depletion layer expands in the lower DBR minor 2. Accordingly, the problem of increased capacitance, which is seen in conventional undoped lower DBR mirrors, does not occur.

When $AsH_3$ is used, the concentration of the C doped in the semiconductor layer due to auto-doping can be decreased by increasing the flow rate of the $AsH_3$. With this method, however, an extremely large amount of $AsH_3$ is used, and therefore the manufacturing cost is high. In contrast to this, if the configuration of the lower DBR mirror 2 according to the first embodiment is adopted, the capacity of the lower DBR mirror can be decreased without increasing the manufacturing cost, and therefore this method is preferable.

Next, the lift-off technique is used to form the p-side electrode 15 on the p-type contact layer 14. The p-side electrode 15 is then covered by an SiN film, and an acidic etching liquid or the like is used to etch to a depth reaching the n-type cladding layer 5, thereby forming the cylindrical mesa post.

Next, thermal processing is performed in a water vapor atmosphere to selectively oxidize the Al-containing layer from the periphery of the mesa post M, thereby forming the current confinement layer 9. In this way, the current confinement layer 9 can be easily and accurately formed to have the desired shape by selectively oxidizing the Al-containing layer.

Next, the n-side electrode 4 is formed on the surface of the n-type contact layer 3 on the mesa post M periphery side, and the n-side lead electrode 17 and p-side lead electrode 18 are also formed.

Next, after the upper DBR minor 16 is formed, the rear surface of the n-type GaAs substrate 1 is polished to achieve the desired thickness, and device isolation is performed to complete the surface emitting laser 101. The surface emitting laser 101 is then connected to the controller 102 including a widely known IC driver for laser driving, thereby completing the light source 100.

(DBR Mirror Capacity)

The following describes the DBR minor capacity in more detail. First, the capacity of an 80 μm by 80 μm DBR mirror, which is formed of a periodic structure including 40.5 pairs of a low refractive index layer made from $Al_{0.9}Ga_{0.1}As$ and a high refractive index layer made from GaAs, is calculated while changing the setting value for the carrier concentration. When making this calculation, Calculation 1 is made for a case in which the low refractive index layer and the high refractive index layer have different conductivity, i.e. when one is p-type and the other is n-type, and Calculation 2 is made for a case in which the low refractive index layer and the high refractive index layer are both p-type. Concerning the carrier concentration, one low refractive index layer and one high refractive index layer forming a pair each have the same concentration density. Furthermore, the thickness of each refractive index layer is λ/4n, with the wavelength λ being 1100 nm.

Figure 3:
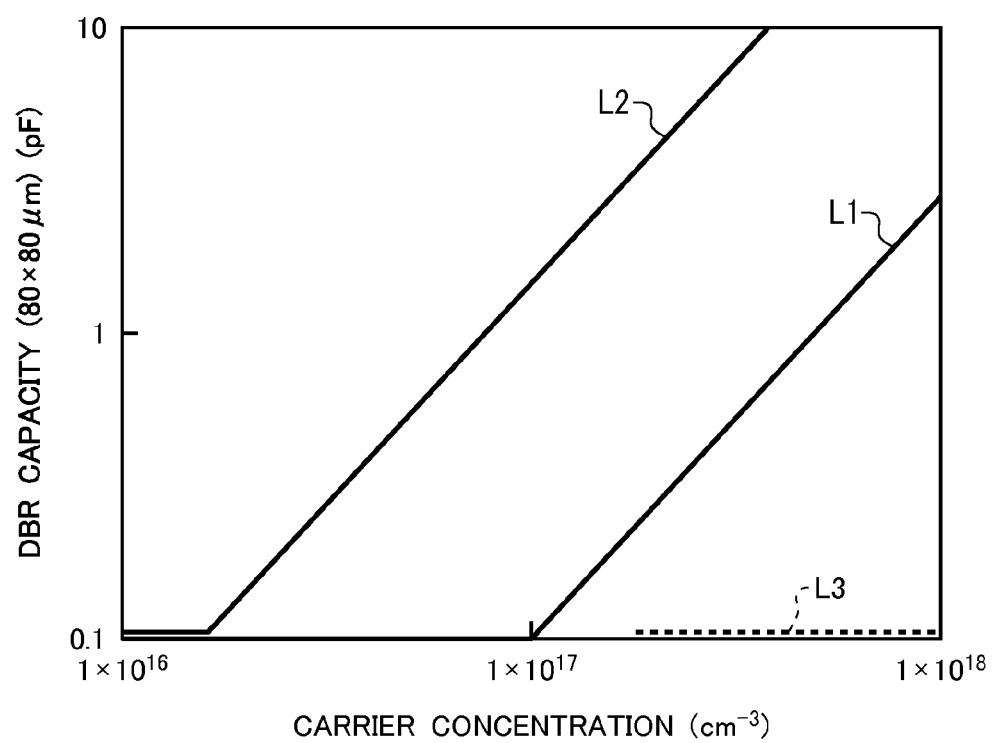
FIG. 3 shows a relationship between the calculated carrier concentration and capacity of the DBR mirror.

FIG. 3 shows a relationship between the calculated carrier concentration and capacity of the DBR mirror. The lines L1 and L2 respectively represent the results of Calculation 1 and Calculation 2. The line L3 indicates a value in a case where the capacity of the DBR minor is not affected by the carriers contained therein and is determined simply by the dielectric constant of GaAs. This value is 0.12 pF. In other words, the line L3 represents the substantial lower limit of the DBR mirror capacity.

FIG. 3 shows that Calculation 1 has lower capacity than Calculation 2. Specifically, it was confirmed that, by adopting a configuration in which the low refractive index layers and the high refractive index layers have different conduction types, as in the first embodiment, the DBR minor capacity can be decreased. In particular, it is preferable that the carrier concentration in the present configuration be less than $1\times10^{17}$ $cm^{-3}$, in order to decrease the capacity to a value at which the carriers in the DBR mirror have approximately no effect.

Figure 4:
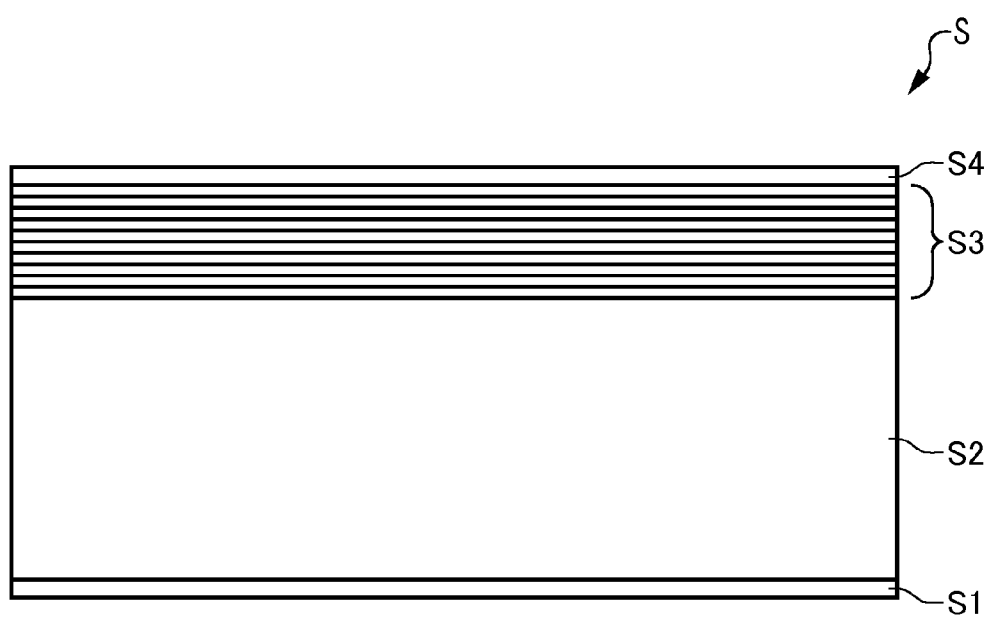
FIG. 4 is a schematic cross-sectional view of a sample S obtained by manufacturing the DBR mirror on a substrate.

The following describes experimentation of manufacturing the DBR minor on a substrate and measuring the capacity thereof. FIG. 4 is a schematic cross-sectional view of a sample S obtained by manufacturing the DBR minor on a substrate. The manufactured sample S was formed by using MOCVD to layer a DBR mirror S3, which has a periodic structure including 40.5 pairs of a low refractive index layer made of $Al_{0.9}Ga_{0.1}As$ and a high refractive index layer made of GaAs, on an n-type GaAs substrate S2 that has an ohmic electrode S1 formed on the back surface thereof, forming an ohmic electrode S4 on the DBR minor S3, and cutting the sample to a size of 600 μm by 600 μm.

Sample groups 1 and 2 were manufactured as described below. Sample group 1 includes p-type low refractive index layers and n-type high refractive index layers, and the carrier concentration is changed for each sample. Sample group 2 includes p-type low refractive index layers and p-type high refractive index layers, and the carrier concentration is changed for each sample. In each sample group, the carrier concentration is the same for each low refractive index layer and high refractive index layer forming a pair. Furthermore, the thickness of each refractive index layer is λ/4n, with the wavelength λ being 1100 nm.

Figure 5:
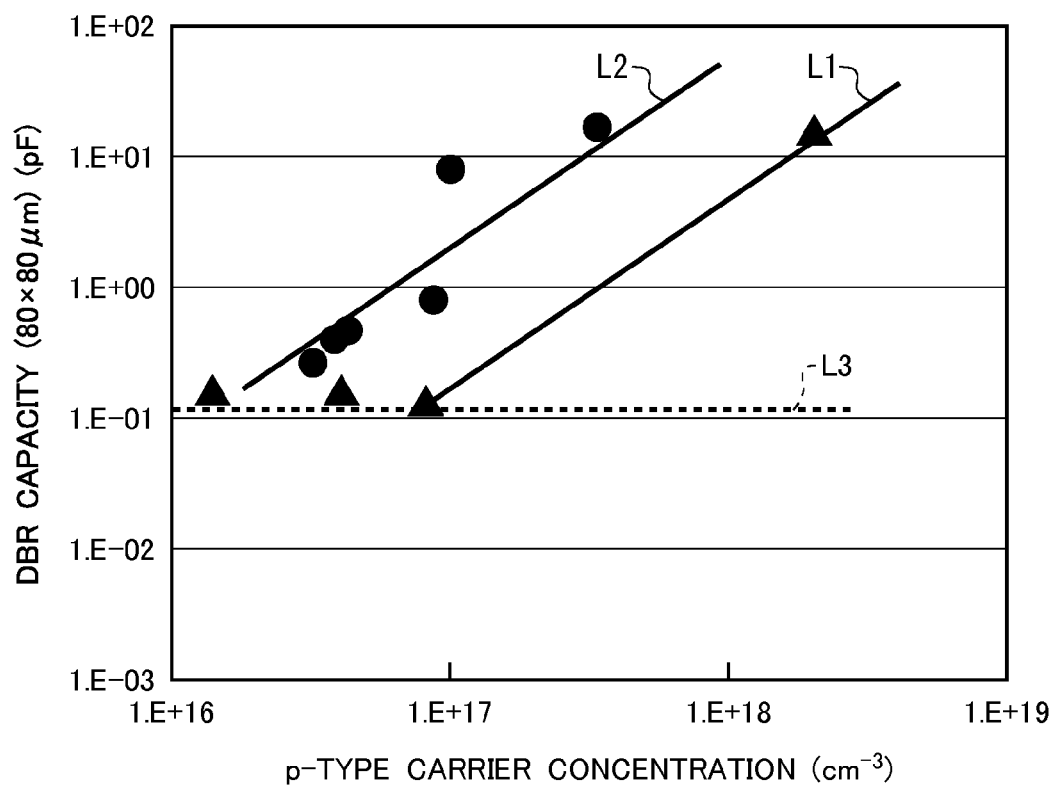
FIG. 5 shows a relationship between the calculated p-type carrier concentration and capacity of the DBR mirror.

FIG. 5 shows a relationship between the calculated p-type carrier concentration and capacitance of the DBR minor. The capacitance on the vertical axis is converted to a value for a size of 80 μm by 80 μm, in order to be compared to the calculations. On the vertical and horizontal axes, "E" is a symbol representing a power of 10, e.g. "1.E+01" is a value of "$1.0\times10^1$." In the same manner as in FIG. 3, the lines L1 and L2 respectively represent the results of Calculation 1 and Calculation 2, and the line L3 indicates a value of 0.12 pF, which is the value in a case where the capacitance of the DBR minor is determined simply by the dielectric constant of GaAs. The black triangles indicate measurement results for sample group 1, and the black circles indicate measurement results for sample group 2.

As shown in FIG. 5, the measurement results of each sample group closely match the corresponding calculations, thereby experimentally confirming that the capacitance of the DBR minor can be decreased by using a configuration in which the low refractive index layers and the high refractive index layers have different conduction types.

As described above, the light source 100 according to the first embodiment has decreased parasitic capacitance and operates at higher speed. In particular, the light source 100 according to the first embodiment can realize a high frequency characteristic of having a cutoff frequency of 20 GHz or more, as is desired in recent years.

(Modification of the First Embodiment)

The following describes a light source 100 according to a modification of the first embodiment. The light source 100 according to the modification of the first embodiment has the configuration shown in FIGS. 1 and 2 and, aside from the lower DBR mirror 2, has the same configuration as the light source 100 according to the first embodiment. The lower DBR mirror 2 of the light source 100 according to the modification of the first embodiment is formed on the n-type GaAs substrate 1 with an undoped GaAs buffer layer interposed therebetween. The lower DBR minor 2 is formed by a multilayer semiconductor minor. The multilayer semiconductor minor forming the lower DBR mirror 2 is formed of a layered structure including low refractive index layers 2a, which are each a first low refractive index layer formed by p-type $Al_{0.9}Ga_{0.1}As$, and high refractive index layers 2b, which are each a first high refractive index layer formed by n-type GaAs. With one low refractive index layer 2a and one high refractive index layer 2b forming one pair, the lower DBR minor 2 may include 40.5 pairs, for example. The thickness of each low refractive index layer 2a and high refractive index layer 2b is λ/4n, where λ is the oscillation wavelength and n is the refractive index. The p-type carrier concentration of each low refractive index layer 2a may be $1\times10^{16}$ $cm^{-3}$ and the n-type carrier concentration of each high refractive index layer 2b may be $1\times10^{15}$ $cm^{-3}$, for example. The low refractive index layers 2a and the high refractive index layers 2b may be formed without being intentionally doped with p-type dopants or n-type dopants.

Figure 6:
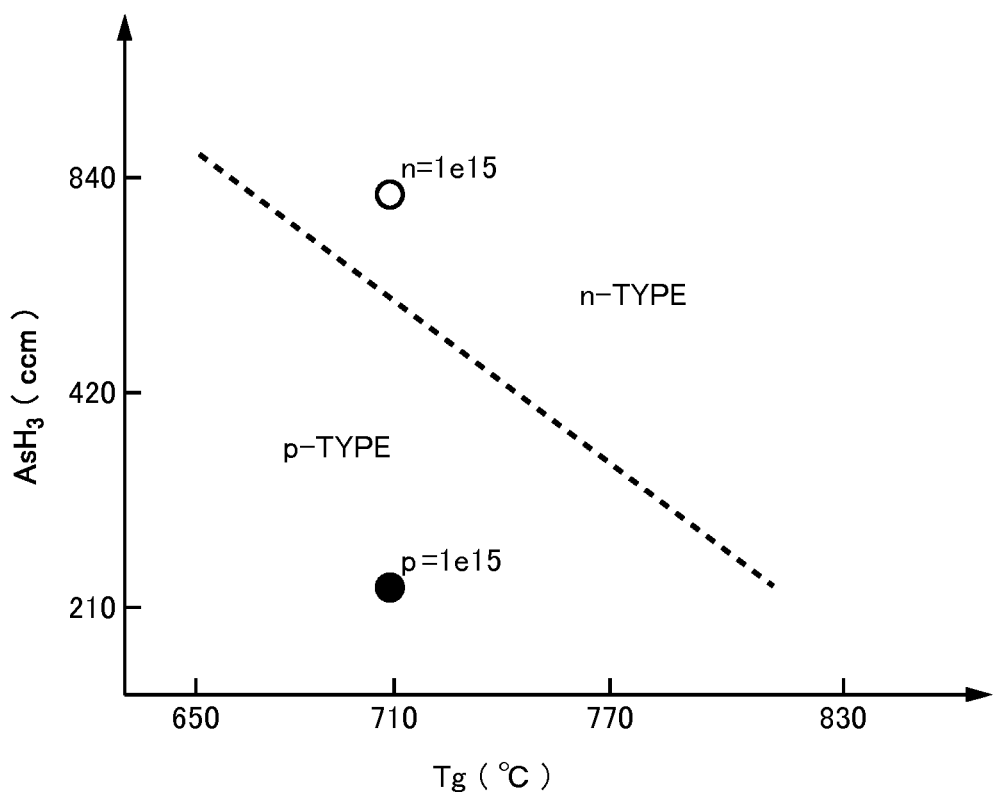
FIG. 6 shows the relationship between the formation conditions of undoped GaAs and conductivity.

FIG. 6 shows the relationship between the formation conditions of undoped GaAs and conductivity. Specifically, in FIG. 6, the vertical axis represents the $AsH_3$ flow rate (ccm) and the horizontal axis represents the growth temperature (° C.), when MOCVD is used to form undoped GaAs that is not intentionally doped with p-type dopants or n-type dopants. The circular marks in the graph of FIG. 6 show experimental results. As seen from the experimental results, when the undoped GaAs that is not intentionally doped with p-type dopants or n-type dopants is formed with a growth temperature of 710° C. and an $AsH_3$ flow rate of 210 ccm, the resulting GaAs has a p-type carrier concentration of $1\times10^{15}$ $cm^{-3}$. Furthermore, when the undoped GaAs that is not intentionally doped with p-type dopants or n-type dopants is formed with a growth temperature of 710° C. and an $AsH_3$ flow rate of 840 ccm, the resulting GaAs has an n-type carrier concentration of $1\times10^{15}$ $cm^{-3}$.

When the growth temperature or the $AsH_3$ flow rate increases during formation of the GaAs, separation of the methyl included in the TMG is encouraged, and therefore the GaAs formed without being intentionally doped with p-type dopants or n-type dopants becomes n-type. In other words, in the upper right region in the graph of FIG. 6, n-type GaAs is formed. On the other hand, when the growth temperature or the $AsH_3$ flow rate decreases during formation of the GaAs, the GaAs formed without being intentionally doped with p-type dopants or n-type dopants becomes p-type, as shown in the lower left region in the graph of FIG. 6. As shown above, even when not intentionally doped with p-type dopants or n-type dopants, the formed GaAs has p-type or n-type conductivity due to residual impurities. The conduction type of the GaAs is determined by whichever type of dopant has the greater amount in a comparison between the amount of p-type dopants and the amount of n-type dopants included in the residual impurities in the GaAs. The p-type dopant may be carbon (C) or zinc (Zn), for example, and the n-type dopant may be silicon (Si) or tin (Sn), for example. The GaAs is n-type if the amount of n-type dopants is greater than the amount of p-type dopants in the residual impurities. The GaAs is p-type if the amount of p-type dopants is greater than the amount of n-type dopants in the residual impurities.

In contrast, when AlGaAs with a high aluminum composition is formed using MOCVD without being intentionally doped with p-type dopants or n-type dopants, the resulting AlGaAs will not be n-type, no matter what the formation conditions are. This is because the bonding energy of the aluminum atoms and the methyl in the TMA is high. Here, the AlGaAs with a high aluminum composition is $Al_{1-x}Ga_xAs$ ($x \leq 0.5$). When forming n-type AlGaAs with a high aluminum composition, n-type dopants such as silicon (Si) or tin (Sn) are added.

The lower DBR mirror 2 of the light source 100 according to the modification of the first embodiment is formed without being intentionally doped with p-type dopants or n-type dopants. In other words, the low refractive index layers 2a, which are first low refractive index layers, and the high refractive index layers 2b, which are first high refractive index layers, are formed in an alternating manner using MOCVD without intentionally being doped with p-type dopants or n-type dopants. For example, the low refractive index layers 2a, which are the first low refractive index layers, may be formed of p-type $Al_{0.9}Ga_{0.1}As$ and the high refractive index layers 2b, which are the first high refractive index layers, may be formed of n-type GaAs, without being intentionally doped with p-type dopants or n-type dopants. At this time, the formation temperature is 710° C. and the $AsH_3$ flow rate is 840 ccm. As a result, the p-type carrier concentration of each low refractive index layer 2a is $1 \times 10^{16}$ cm$^{-3}$ and the n-type carrier concentration of each high refractive index layer 2b is $1 \times 10^{15}$ cm$^{-3}$.

In the surface emitting laser 101 of the light source 100 according to the modification of the first embodiment, the lower DBR mirror 2 is formed by a periodic structure including p-type low refractive index layers 2a and n-type high refractive index layers 2b. Therefore, the capacitance of the lower DBR mirror 2 is decreased due to the widening of the depletion layer at the pn junction interface between the low refractive index layers 2a and the high refractive index layers 2b. As a result, the surface emitting laser 101 has decreased parasitic capacitance, thereby preventing a decrease in the cutoff frequency and enabling operation at higher speed.

(Second Embodiment)

Figure 7:
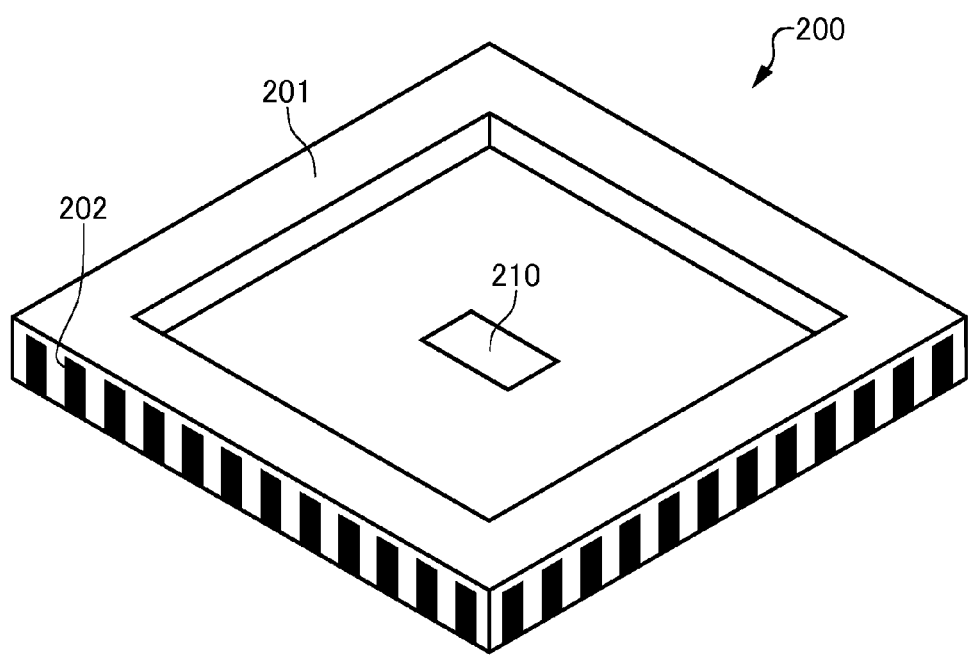
FIG. 7 is a schematic perspective view of the surface emitting laser array according to the second embodiment.

The following describes a second embodiment of the present invention, which is a surface emitting laser array apparatus that uses the surface emitting laser of the present invention and is used in a signal light source, for example, for optical interconnection. FIG. 7 is a schematic perspective view of the surface emitting laser array apparatus according to the second embodiment. As shown in FIG. 7, the surface emitting laser array apparatus 200 is realized by mounting a surface emitting laser array chip 210 on a flat package 201, which is a widely known ceramic leaded chip carrier (CLCC). The surface emitting laser array chip 210 is connected to a metal caster (electrode) 202 by wiring, not shown.

Figure 8:
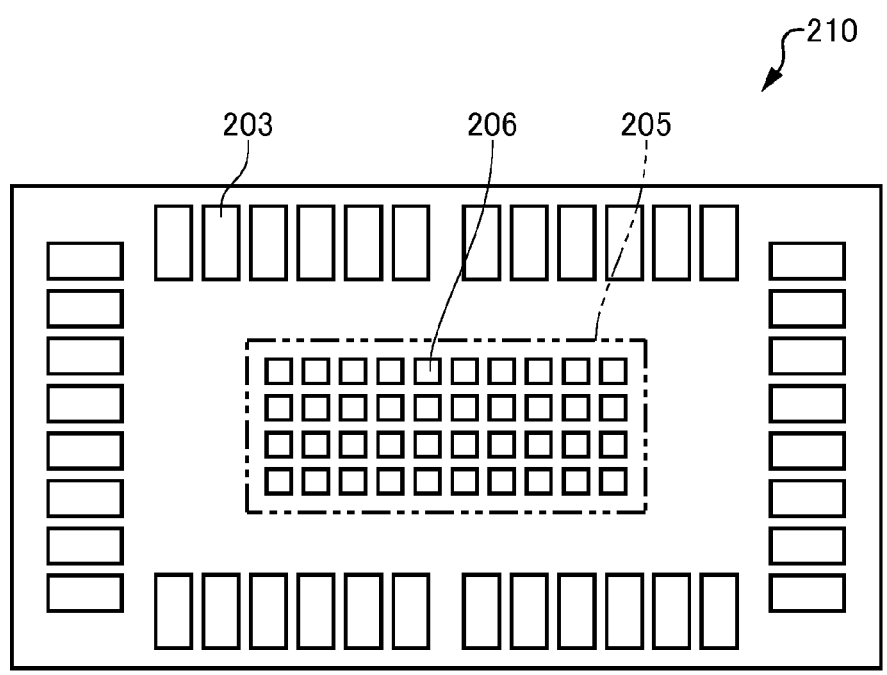
FIG. 8 is a schematic planar view of the surface emitting laser array shown in FIG. 7.

FIG. 8 is a schematic planar view of the surface emitting laser array chip 210 shown in FIG. 7. As shown in FIG. 8, the surface emitting laser array chip 210 includes a surface emitting laser array section 205 formed by a two-dimensional arrangement of 40 of the surface emitting lasers 206 of the present invention, and a plurality of electrode pads 203 arranged around the surface emitting laser array section 205 and connected via wiring, not shown, to the electrodes of each surface emitting laser 206 in the surface emitting laser array section 205. Furthermore, each electrode pad 203 is connected to a metal caster 202 of the flat package 201. The metal casters 202 are electrically connected to an external control circuit, not shown, that controls the light emission of each surface emitting laser 206. The surface emitting laser 101 according to the first embodiment, for example, can be used as each surface emitting laser 206.

The following describes the operation of the surface emitting laser array apparatus 200. Each surface emitting laser 206 in the surface emitting laser array section 205 has a bias voltage and a modulated voltage applied thereto from the external control circuit, via the metal casters 202 and electrode pads 203, and emits a laser signal with a prescribed wavelength from the top thereof.

The surface emitting laser array apparatus 200 has a reduced parasitic capacitance and the jitter is restricted during modulation by restricting electrical crosstalk between the surface emitting lasers 206, and therefore can operate at high speed.

The surface emitting laser array section 205 of the surface emitting laser array apparatus 200 includes the surface emitting lasers 206 in a two-dimensional arrangement, but this arrangement may instead be one-dimensional. The number of surface emitting lasers 206 forming the surface emitting laser array section 205 is not particularly limited. For example, the use of a one-dimensional arrangement of 4 to 15 surface emitting lasers as the signal light source for optical interconnection is favorable in current optical modules.

(Third Embodiment)

Figure 9:
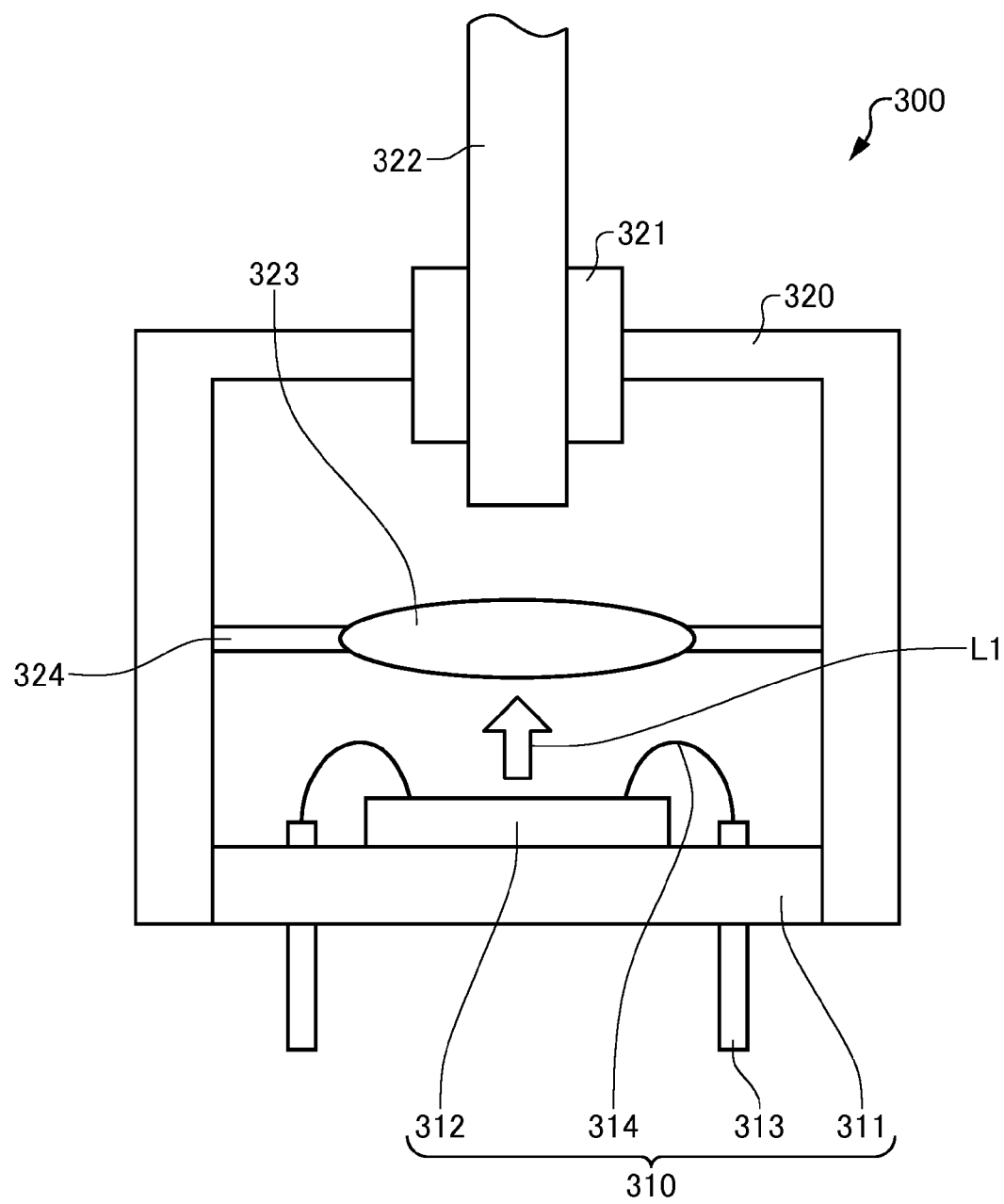
FIG. 9 is a schematic cross-sectional view of the surface emitting laser package according to the third embodiment.

The following describes a third embodiment of the present invention, which is a surface emitting laser package that is a light source including the surface emitting laser of the present invention and that is used in a signal light source for optical interconnection, for example. FIG. 9 is a schematic cross-sectional view of the surface emitting laser package according to the third embodiment. As shown in FIG. 9, the surface emitting laser package 300 includes a surface emitting laser module 310, a housing 320 that houses the surface emitting laser module 310, a lens 323 that is held above the surface emitting laser module 310 by the housing 320 via an arm 324, an optical fiber mount 321 provided above the housing 320, and an optical fiber 322 that is inserted into and held by the optical fiber mount 321. The surface emitting laser module 310 includes the surface emitting laser 312 of the present invention, a substrate 311 on which the surface emitting laser 312 is mounted, electrodes 313 provided on the substrate 311, and wires 314 that connect the surface emitting laser 312 to the electrodes 313. The electrodes 313 are electrically connected to an external control circuit, not shown, for controlling the light emitting state of the surface emitting laser module 310. The surface emitting laser 101 according to the first embodiment, for example, can be used as the surface emitting laser 312.

The following describes the operation of the surface emitting laser package 300. A bias voltage and modulated voltage are applied to the surface emitting laser 312 from the external control circuit, via the electrodes 313 and the wires 314, and the surface emitting laser 312 emits laser signal light L1 with a prescribed wavelength from the top thereof. The lens 323 focuses the laser signal light L1 in the optical fiber 322. The optical fiber 322 propagates the focused laser signal light L1.

The surface emitting laser package 300 has reduced parasitic capacitance, and can therefore operate at high speed.

(Fourth Embodiment)

Figure 10:
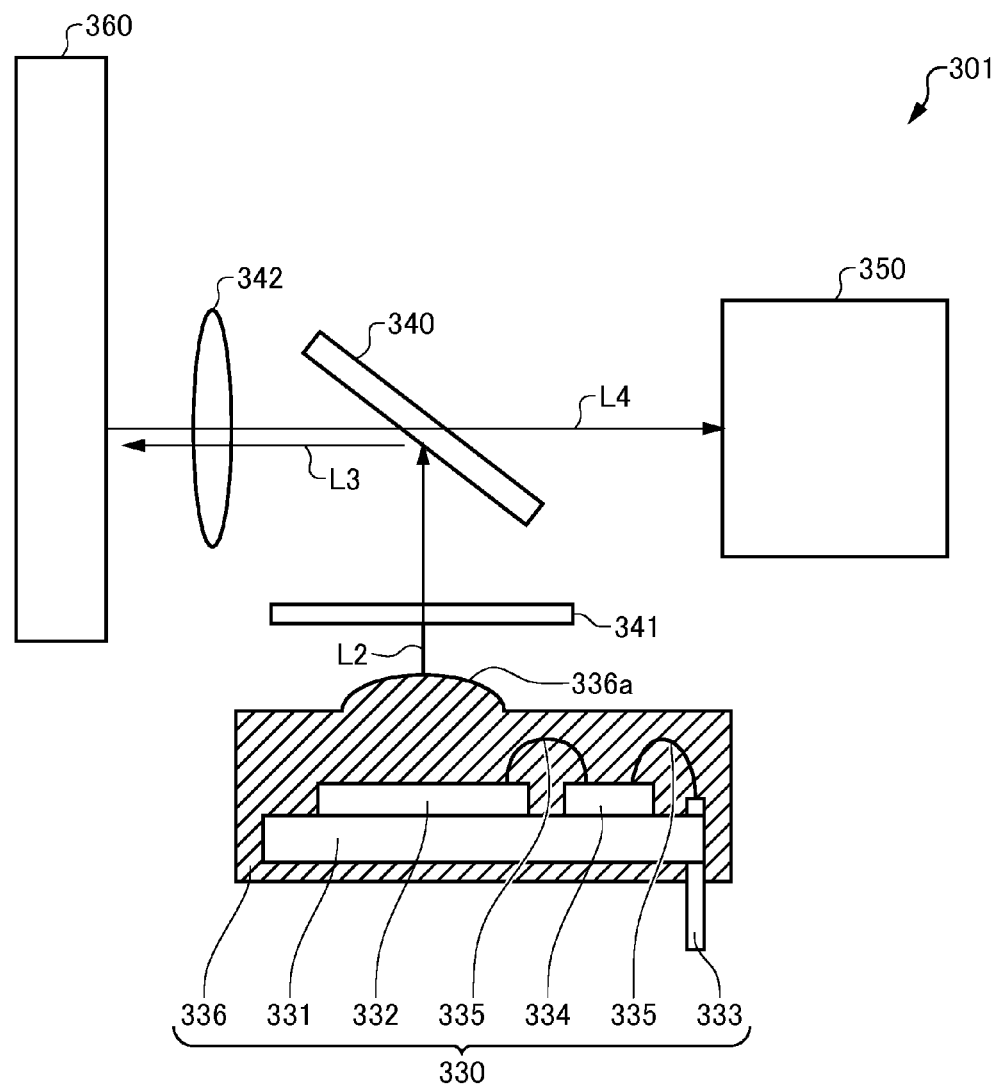
FIG. 10 is a schematic view of a partial cross section of the optical pickup according to the fourth embodiment.

The following describes a fourth embodiment of the present invention, which is a light source that includes the surface emitting laser of the present invention and serves as an optical pickup in an apparatus for writing and reading to and from an optical storage medium. FIG. 10 is a schematic view of a partial cross section of the optical pickup according to the fourth embodiment. As shown in FIG. 10, the optical pickup 301 includes a surface emitting laser module 330, a half minor 340 arranged above the surface emitting laser module 330, a diffraction grating 341 arranged between the surface emitting laser module 330 and the half minor 340, a lens 342 arranged between the half mirror 340 and an optical storage medium 360, and an optical sensor 350 arranged opposite the optical storage medium 360 to sandwich the half minor 340. The surface emitting laser module 330 includes the surface emitting laser 332 of the present invention a substrate 331 on which the surface emitting laser 332 is loaded, a electrode 333 provided on the substrate 331, a drive IC 334 mounted on the substrate 331, wires 335 that sequentially connect the surface emitting laser 332, the drive IC 334, and the electrode 333, and a resin 336 that seals these components.

The surface emitting laser 101 according to the first embodiment, for example, can be used as the surface emitting laser 332. The upper portion of the resin 336 is machined to be convex, thereby forming a lens 336a. The electrode 333 is electrically connected to an external control circuit, not shown, for controlling the light emitting state of the optical pickup 301.

The following describes the operation of the optical pickup 301 when reading information stored in the optical storage medium 360. A bias voltage and a modulated voltage are applied to the surface emitting laser 332 by the drive IC 334 that is supplied with power and an electrical signal from the external control circuit via the electrode 333 and the wire 335, and the surface emitting laser 332 emits laser signal light L2 from the top thereof. The lens 336a of the resin 336 collimates the laser signal light L2 into laser signal light L3. The half minor 340 focuses the laser signal light L3 at a prescribed location of the optical storage medium 360. At this point, the laser signal light L3 is reflected by the optical storage medium 360 to generate reflected signal light L4 that includes the information recorded in the optical storage medium 360. The reflected signal light L4 passes sequentially through the lens 342 and the half minor 340. The optical sensor 350 receives the reflected signal light L4. After this, the optical sensor 350 converts the reflected laser light L4 into an electrical signal, this electrical signal is transmitted to a personal computer, for example, connected to a reading/writing apparatus, and the recorded information is read.

The optical pickup 301 has reduced parasitic capacitance, and can therefore operate at high speed.

In the third and fourth embodiments, the surface emitting lasers may be replaced with surface emitting laser array apparatuses such as described in the second embodiment, for example.

The third and fourth embodiments describe examples in which the surface emitting laser of the present invention is an optical pickup used in a surface emitting laser package for communication or in an apparatus for writing and reading information to and from an optical storage medium, but the surface emitting laser of the present invention is not limited to this. For example, the surface emitting laser of the present invention can be used as optical equipment such as measuring equipment, a laser pointer, or an optical mouse, or as a light source for scanning in a printer or photoresist, a light source for laser pumping, or a light source in a fiber laser for laser machining.

(Fifth Embodiment)

Figure 11:
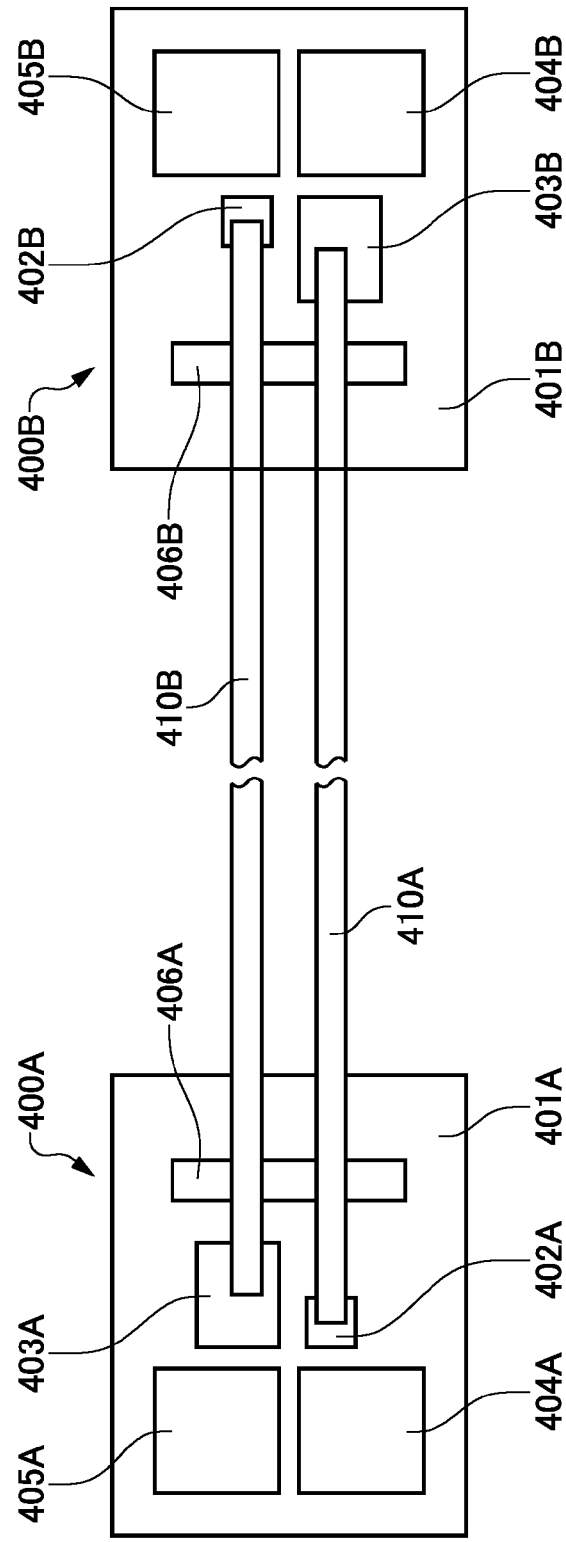
FIG. 11 is a schematic planar view of a state in which two optical transceiver modules are connected via two optical waveguides, according to the fifth embodiment.

The surface emitting laser array and the surface emitting laser of the present invention can be combined with the optical waveguide to form a variety of optical modules. The following describes a fifth embodiment of the present invention, which is an optical transceiver module that is an optical module using the surface emitting laser of the present invention. FIG. 11 is a schematic planar view of a state in which two optical transceiver modules 400A and 400B are connected via two optical waveguides 410A and 410B, according to the fifth embodiment. In FIG. 11, the optical transceiver module 400A is formed by the holding member 401A and the components arranged on the holding member 401A, which are a spacer 406A that has optical waveguides 410A and 410B, which are optical fibers, for example, mounted thereon to set the positions of the optical waveguides 410A and 410B; the surface emitting laser 402A of the present invention that transmits an optical signal via the optical waveguide 410A; a light receiving device 403A that converts the optical signal transmitted via the optical waveguide 410B into an electrical signal; a drive circuit 404A that controls the light emitting state of the surface emitting laser 402A; and an amplifier circuit 405A that amplifies the electrical signal resulting from the conversion by the light receiving device 403A. The surface emitting laser 402A emits light via the drive circuit 404A, according to a control signal from an external control section, not shown. The electrical signal resulting from the conversion by the light receiving device 403A is transmitted to the control section via the amplifier circuit 405A. To avoid a needlessly complex description, explanations of the wire bonding between the drive circuit 404A and the surface emitting laser 402A and between the amplifier circuit 405A and the light receiving device 403A are omitted.

The optical transceiver module 400B has the same configuration as the optical transceiver module 400A, except that the configuration for transmission and the configuration for reception are switched with those of the optical transceiver module 400A. In other words, the optical transceiver module 400B is formed by the holding member 401B and the components arranged on the holding member 401B, which are a spacer 406B that has optical waveguides 410A and 410B mounted thereon to set the positions of the optical waveguides 410A and 410B; the surface emitting laser 402B of the present invention that transmits an optical signal via the optical waveguide 410B; a light receiving device 403B that converts the optical signal transmitted via the optical waveguide 410A into an electrical signal; a drive circuit 404B that controls the light emitting state of the surface emitting laser 402B; and an amplifier circuit 405B that amplifies the electrical signal resulting from the conversion by the light receiving device 403B. The surface emitting laser 402B emits light via the drive circuit 404B, according to a control signal from an external control section, not shown. The electrical signal resulting from the conversion by the light receiving device 403B is transmitted to the control section via the amplifier circuit 405B.

The optical transceiver modules 400A and 400B use the surface emitting lasers 402A and 402B of the present invention, which have reduced parasitic capacitance, and can therefore operate at high speed.

The following provides a detailed description of an optical coupling portion between the surface emitting lasers 402A and 402B and the optical waveguides 410A and 410B in the optical transceiver modules 400A and 400B shown in FIG. 11. The following describes the optical coupling portion using the optical transceiver module 400A, the surface emitting laser 402A, and the optical waveguide 410A, but the same description is applicable to a combination of the optical transceiver module 400B, the surface emitting laser 402B, and the optical waveguide 410B.

Figure 12:
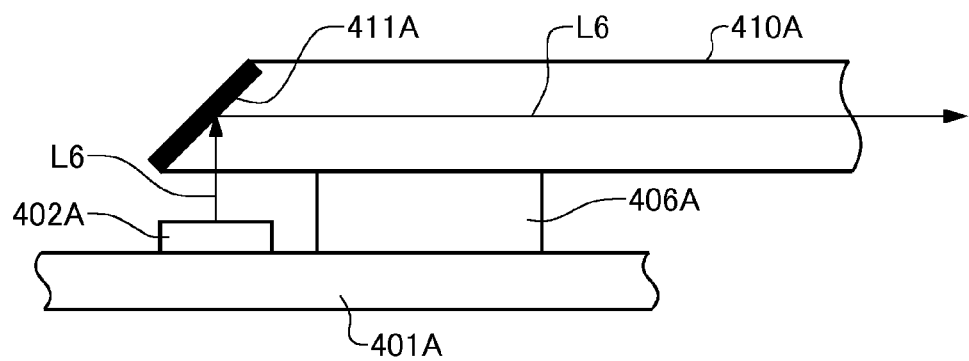
FIG. 12 is a side view of an exemplary optical coupling portion between the surface emitting laser and the optical waveguide in the optical transceiver module shown in FIG. 11.

FIG. 12 is a side view of an exemplary optical coupling portion between the surface emitting laser 402A and the optical waveguide 410A in the optical transceiver module 400A shown in FIG. 11. As shown in FIG. 12, the end surface of the optical waveguide 410A is machined to have an inclination of approximately 45 degrees relative to the optical axis, a reflective film 411A is formed on the end surface as an optical coupling means, and the reflective film 411A is mirror-processed. The relative positioning of the surface emitting laser 402A and the reflective film 411A is determined by the spacer 406A, and is adjusted such that the surface emitting laser 402A is positioned below the reflective film 411A. The optical signal L6 emitted from the surface emitting laser 402A is reflected by the reflective film 411A, focused by the optical waveguide 410A, and propagated in the optical waveguide 410A.

Figure 13:
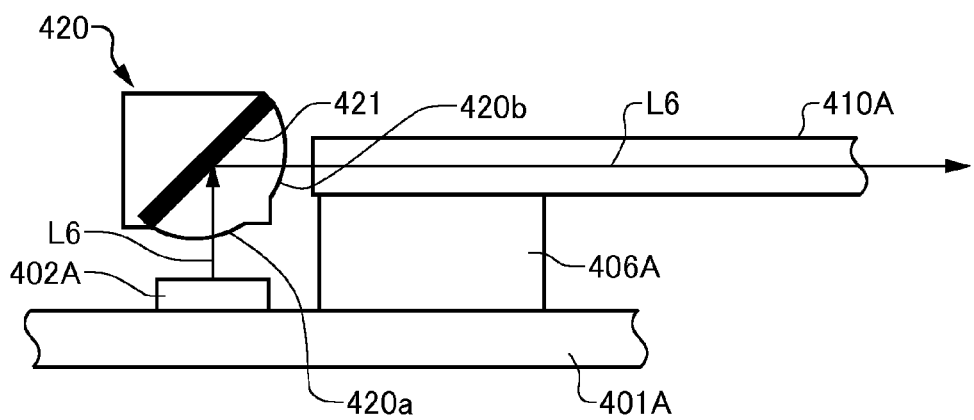
FIG. 13 is a side view of another exemplary optical coupling portion between the surface emitting laser and the optical waveguide.

FIG. 13 is a side view of another exemplary optical coupling portion between the surface emitting laser 402A and the optical waveguide 410A. In the example of FIG. 13, the optical coupling means is a mirror assembly 420 that is positioned above the surface emitting laser 402 and on the end surface side of the optical waveguide 410A and includes therein a reflective surface 421, which has an input surface 420a facing the surface emitting laser 402A and an output surface 420b facing the end surface of the optical waveguide 410A. The optical signal L6 emitted from the surface emitting laser 402A is input to the minor assembly 420 from the input surface 420a, reflected by the reflective surface 421, emitted from the output surface 420b, focused at the end surface of the optical waveguide 410A, and propagated in the optical waveguide 410A. A microlens (array) for focusing and collimating may be provided on the input surface 420a and/or the output surface 420b of the mirror assembly 420.

Figure 14:
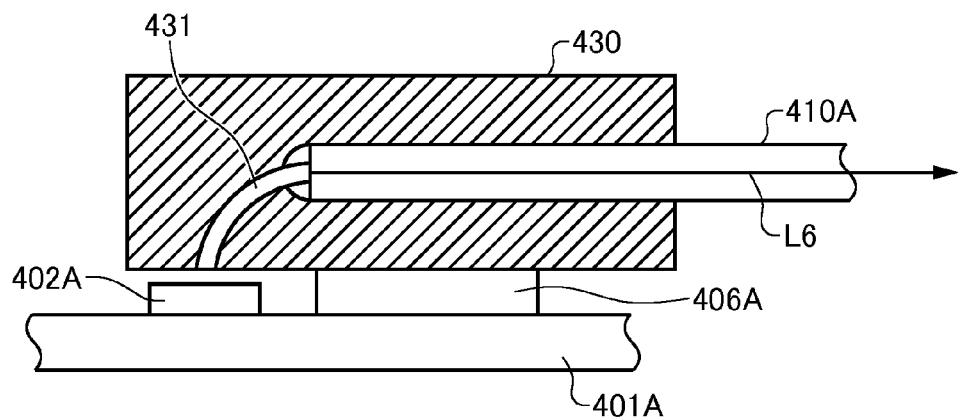
FIG. 14 is a partial cross-sectional view of another example of an optical coupling portion between the surface emitting laser and the optical waveguide.

FIG. 14 is a partial cross-sectional view of another example of an optical coupling portion between the surface emitting laser 402A and the optical waveguide 410A. In the example of FIG. 14, the optical waveguide 410A, which is an optical fiber, is held by the connector housing 430 mounted on the spacer 406A and, as the optical coupling means, an optical fiber core 431 is gradually curved and held such that one end surface is connected to the optical waveguide 410A and the other end surface faces the surface emitting laser 402A. The optical signal L6 emitted from the surface emitting laser 402A is input to the end surface of the optical fiber core 431 and propagated through the optical fiber core 431, and is then focused and propagated in the optical waveguide 410A.

Figure 15:
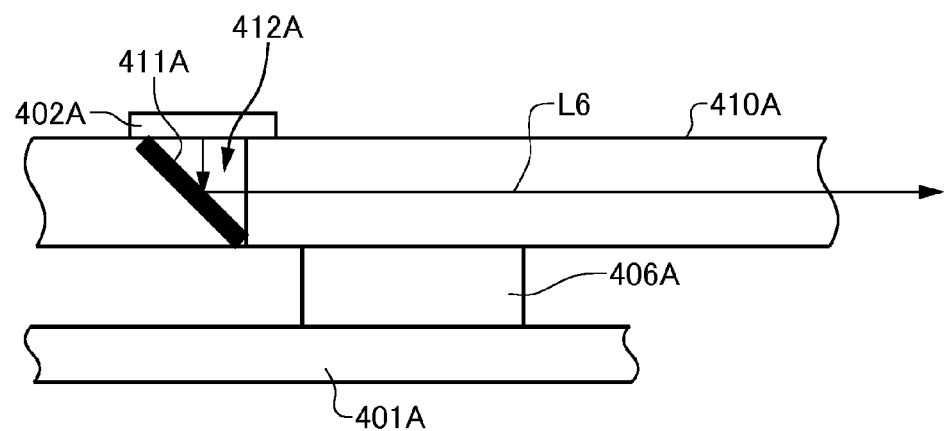
FIG. 15 is a side view of another example of an optical coupling portion between the surface emitting laser and the optical waveguide.

FIG. 15 is a side view of another example of an optical coupling portion between the surface emitting laser 402A and the optical waveguide 410A. As shown in the example of FIG. 15, a wedge-shaped groove 412A having an inner surface inclined approximately 45 degrees with respect to the optical axis is formed in the optical waveguide 410A mounted on the spacer 406A. A reflective film 411A is formed on this inclined inner surface, and is mirror-processed. The groove 412A and the reflective film 411A form the optical coupling means. The surface emitting laser 402A is directly attached to the optical waveguide 410A at a position above the groove 412A. The surface emitting laser 402A is configured such that the optical signal L6 is emitted downward, i.e. toward the substrate. The optical signal L6 emitted from the surface emitting laser 402A is reflected by the reflective film 411A formed on the inclined surface of the groove 412A, focused at the optical waveguide 410, and propagated in the optical waveguide 410.

(Sixth Embodiment)

Figure 16:
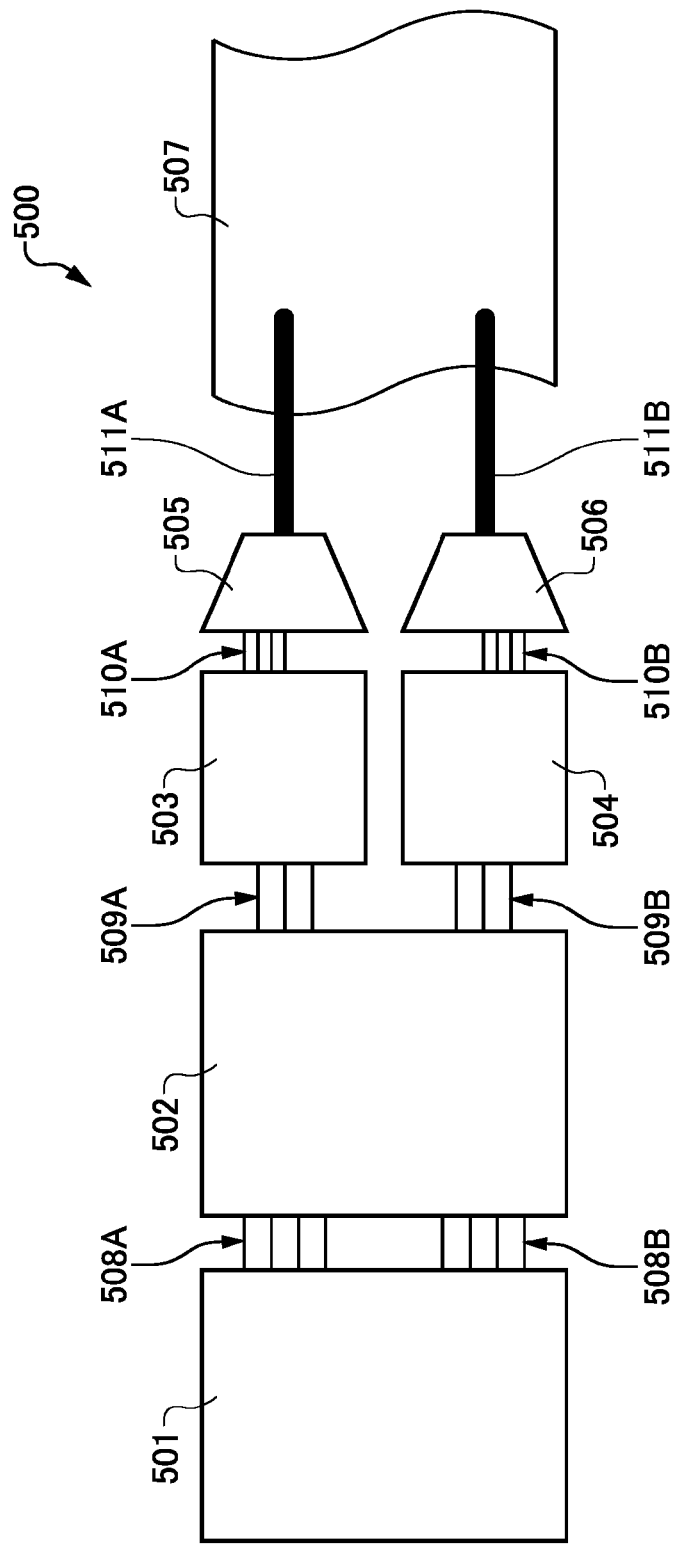
FIG. 16 is a schematic configurational view of a wavelength-multiplexing transmission system according to the sixth embodiment.

The following describes a sixth embodiment of the present invention, which is an optical communication system using the surface emitting laser array and the surface emitting laser of the present invention. FIG. 16 is a schematic configurational view of a wavelength-multiplexing transmission system according to the sixth embodiment. As shown in FIG. 16, the wavelength-multiplexing transmission system 500 includes a signal generating and processing means 501, which is a computer, board, or chip, for example; a communication control circuit 502 formed by a CPU, MPU, or wavelength control circuit, for example, and connected to the signal generating and processing means 501 via electric wirings 508A and 508B; a surface emitting laser array 503 and an integrated light receiving element section 504 connected to the communication control circuit 502 respectively by electric wirings 509A and 509B; a wavelength multiplexing and combining unit 505 connected to the surface emitting laser array 503 by an optical fiber array 510A; a wavelength multiplexing and splitting unit 506 connected to the integrated light receiving element section 504 by an optical fiber array 510B; and a communication target 507, which is a network, PC, board or chip, for example, connected to the wavelength multiplexing and combining unit 505 and the wavelength multiplexing and splitting unit 506 respectively by optical fibers 511A and 511B. The surface emitting laser array 503 is a one-dimensional or two-dimensional arrangement of the surface emitting lasers of the present invention that each have a different oscillation wavelength.

The following describes the operation of the wavelength-multiplexing transmission system 500. The signal generating and processing means 501 generates an electrical signal to be transmitted to the communication target 507, and transmits this electrical signal to the communication control circuit 502 via the electric wiring 508. The communication control circuit 502 provides the surface emitting laser array 503 with drive power via the electric wiring 509A, and provides a different signal to each surface emitting laser forming the surface emitting laser array 503 to generate an optical signal. Each optical fiber forming the optical fiber array 510A is optically coupled to a surface emitting laser forming the surface emitting laser array 503, and each optical fiber transmits the generated optical signal to the wavelength multiplexing and combining unit 505 via a different optical fiber. The wavelength multiplexing and combining unit 505 wavelength-multiplexes and combines the transmitted optical signals, and focuses the resulting optical signal in the optical fiber 511A. The optical fiber 511A transmits this optical signal to the communication target 507.

The wavelength multiplexing and splitting unit 506 splits the wavelength-multiplexed and combined optical signal transmitted from the communication target 507 via the optical fiber 511B into individual wavelengths, and focuses the resulting optical signals respectively to the optical fibers forming the optical fiber array 510B. The optical fiber array 510B transmits each of the optical signals to the integrated light receiving element section 504. The light receiving devices forming the integrated light receiving element section 504 are optically coupled to respective optical fibers forming the optical fiber array 510, and each receive an optical signal, convert the optical signal into an electrical signal, and transmit the electrical signal to the communication control circuit 502 via the electric wiring 509B. The communication control circuit 502 transmits each electrical signal to the signal generating and processing means 501 via the electric wiring 508B. The signal generating and processing means 501 performs signal processing on each electrical signal.

The wavelength-multiplexing transmission system 500 uses the surface emitting laser array 503 of the present invention, which has reduced parasitic capacitance, and can therefore perform wavelength-multiplexed transmission with high capacity at high speed. The optical signals from the surface emitting lasers forming the surface emitting laser array 503 are focused into the signal optical fiber 511A by the wavelength multiplexing and combining unit 505, and therefore a high-capacity signal can be transmitted with high throughput through one fiber.

Depending on the intended use, the wavelength-multiplexing transmission system 500 can be made a parallel transmission system by connecting the surface emitting laser array 503 and the integrated light receiving element section 504 to the communication target 507 directly through the optical fiber array. Furthermore, the surface emitting laser array of the present invention has excellent high-frequency modulation characteristics, and can therefore realize long-distance communication over 200 m with a transmission rate exceeding 50 Gbit/s.

In the above embodiments, the entire lower DBR mirror is formed by first low refractive index layers and first high refractive index layers having different conductivity, but the present invention is not limited to this, and only a portion of the lower DBR minor must include first low refractive index layers and first high refractive index layers having different conductivity. In the above embodiments, the first low refractive index layers are p-type and the first high refractive index layers are n-type, but it is only necessary that the conduction types differ from each other, and therefore the first low refractive index layers may be n-type and the first high refractive index layers may be p-type.

In the above embodiments, the entire upper DBR mirror is formed by a multilayer dielectric film, but only a portion of the upper DBR minor must be formed by a multilayer dielectric film, and the remaining portion may be a multilayer semiconductor film. The upper DBR mirror may be formed of a multilayer semiconductor material, and the upper electrode may be formed on the upper DBR mirror. In other words, the upper portion of the active layer need not have an intra-cavity structure.

The semiconductor material forming the surface emitting laser is not limited to AlGaAs and GaInAs types, and depending on the laser oscillation wavelength, other semiconductor material such as InP-types can be used. The present invention describes embodiments that use a GaAs substrate, but an InP substrate may be used instead. In such a case, the layer that undergoes oxidization is AlGaInAs or AlInAs.

The semiconductor material of the lower multilayer reflective semiconductor mirror is selected as needed according to the laser oscillation wavelength. For example, the first low refractive index layers may be made of AlGaAs and the first high refractive index layers may be made of (Al)GaAs. As another example, the first low refractive index layers may be made of AlGaInP and the first high refractive index layers may be made of (Al)GaInP. As yet another example, the first low refractive index layers may be made of InP and the first high refractive index layers may be made of AlGaInAs. Here, (Al)GaAs and (Al)GaInP are meant to include cases where the Al composition is zero.

In the above embodiments, an n-type semiconductor layer is formed between the substrate and the active layer and a p-type semiconductor layer is formed above the active layer, but instead, an n-type semiconductor layer may be formed above the active layer.

In the above embodiments, the present invention is applied in a surface emitting laser, but the present invention is not limited to this, and may be applied in other electronic devices such as a semiconductor modulator. Specifically, as long as the electronic device includes a multilayer semiconductor structure formed by a periodic structure having a first semiconductor layer and a second semiconductor layer and the first and second semiconductor layers have different conduction types in at least a portion of the multilayer semiconductor structure, the depletion layer at the pn junction interface between the first semiconductor layer and the second semiconductor layer widens, and therefore the parasitic capacitance can be decreased to enable high speed operation.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above, the embodiments of the present invention can be used to realize an electronic device, a surface emitting laser, a surface emitting laser array, a light source, and an optical module with significantly reduced parasitic capacitance.

What is claimed is:

1. A surface emitting laser comprising:
    a lower multilayer reflective semiconductor mirror formed by a periodic structure having a first low refractive index layer and first high refractive index layer, which has a higher refractive index than the first low refractive index layer;
    an upper multilayer reflective mirror formed by a periodic structure having a second low refractive index layer and second high refractive index layer, which has a higher refractive index than the second low refractive index layer;
    an active layer provided between the lower multilayer reflective semiconductor mirror and the upper multilayer reflective mirror; and
    a lower contact layer that is provided between the active layer and the lower multilayer reflective semiconductor mirror, and on which is formed a lower electrode for supplying current to the active layer, wherein
    in at least a portion of the lower multilayer reflective semiconductor mirror, the first low refractive index layer and the first high refractive index layer have different conduction types.

2. The surface emitting laser according to claim 1, wherein p-type and n-type carrier concentrations in the first low refractive index layer and the first high refractive index layer having different conduction types are both lower than $1 \times 10^{17}$ cm$^{-3}$.

3. The surface emitting laser according to claim 1, wherein the lower multilayer reflective semiconductor minor includes an element that has a property of capturing carbon.

4. The surface emitting laser according to claim 3, wherein the element having the property of capturing carbon is aluminum (Al).

5. The surface emitting laser according to claim 1, wherein in the lower multilayer reflective semiconductor mirror, the first low refractive index layer is made of AlGaAs and the first high refractive index layer is made of (Al)GaAs.

6. The surface emitting laser according to claim 1, wherein in the lower multilayer reflective semiconductor mirror, the first low refractive index layer is made of AlGaInP and the first high refractive index layer is made of (Al)GaInP.

7. The surface emitting laser according to claim 1, wherein in the lower multilayer reflective semiconductor mirror, the first low refractive index layer is made of InP and the first high refractive index layer is made of AlGaInAs.

8. The surface emitting laser according to claim 1, comprising:
   a current confinement layer that is provided between the upper multilayer reflective minor and the active layer, and that includes a current injecting section made of $Al_{1-x}Ga_xAs$ ($0 \le x < 0.2$) and a current confining section made of $(Al_{1-x}Ga_x)_2O_3$ and formed by selective oxidation;
   an upper contact layer that is provided between the upper multilayer reflective mirror and the current confinement layer and that has an upper electrode formed thereon to supply current to the active layer; and
   a high conductivity layer that is provided between the upper contact layer and the current confinement layer and has higher conductivity than the upper contact layer.

9. The surface emitting laser according to claim 1, wherein a cutoff frequency is greater than or equal to 20 GHz.

10. The surface emitting laser according to claim 2, wherein
   the first low refractive index layer and the first high refractive index layer are both formed without being intentionally doped with p-type dopants or n-type dopants.

11. The surface emitting laser according to claim 2, wherein
   whichever of the first low refractive index layer and the first high refractive index layer has n-type conductivity is intentionally doped with n-type dopants.

12. A surface emitting laser array comprising a plurality of the surface emitting lasers according to claim 1 arranged in a one-dimensional or two-dimensional array.

13. A light source comprising:
   the surface emitting laser according to claim 1; and
   a controller that applies a modulated signal to the surface emitting laser.

14. A light source comprising:
   the surface emitting laser array according to claim 12; and
   a controller that applies a modulated signal to the surface emitting laser array.

15. An optical module comprising the surface emitting laser according to claim 1.

16. An optical module comprising the surface emitting laser array according to claim 12.

17. An optical module comprising the light source according to claim 13.

18. An optical module comprising the light source according to claim 14.

* * * * *